United States Patent [19]

Kohler et al.

[11] Patent Number: 5,270,640

[45] Date of Patent: Dec. 14, 1993

[54] METHOD FOR INCIPIENT FAILURE DETECTION IN ELECTRIC MACHINES

[75] Inventors: Jeffrey L. Kohler, Spring Mills, Pa.; Joseph Sottile, Jr., Lexington, Ky.

[73] Assignee: The Penn State Research Foundation, University Park, Pa.

[21] Appl. No.: 872,565

[22] Filed: Apr. 23, 1992

[51] Int. Cl.⁵ ............................................. G01R 21/00
[52] U.S. Cl. ........................ 324/158 MG; 364/551.01
[58] Field of Search ............ 324/158 R, 158 MG, 545, 324/547; 340/648; 318/690, 490; 322/99; 364/483, 481, 551.01, 550

[56] References Cited

U.S. PATENT DOCUMENTS

| | | | |
|---|---|---|---|
| 4,377,784 | 3/1983 | Saito et al. | 340/648 |
| 4,914,386 | 4/1990 | Zocholl | 324/158 MG |
| 5,126,678 | 6/1992 | William | 324/158 MG |

OTHER PUBLICATIONS

"Alternatives for assessing the electrical integrity of induction motors", Conference Record of the 1989 IEEE Industry Applications Society Annual Meeting Part II., Kohler et al, pp. 1580–1586, Oct. 1-5, 1989.

*Primary Examiner*—Vinh Nguyen
*Attorney, Agent, or Firm*—Thomas J. Monahan

[57] ABSTRACT

An improved method for detecting an incipient failure in a multiphase electric motor includes the following steps: periodically measuring or continuously monitoring voltage and current values at each input to the motor; determining negative sequence voltage and current values for each periodic measured input voltage and current value; calculating an effective negative sequence impedance phasor value angle from each of the determined negative sequence voltages and current values; and comparing the calculated negative sequence impedance phasor angles and/or real and imaginary components over a plurality of periodic measurements to detect a change therein, which change is indicative of an incipient failure mode.

9 Claims, 6 Drawing Sheets

POSITIVE-SEQUENCE COMPONENT

FIG. 3

NEGATIVE-SEQUENCE COMPONENT

FIG. 4

ZERO-SEQUENCE COMPONENT

FIG. 5

RESULTING PHASE VALUES

PERIODICALLY: Ⓐ

60 — READ AND STORE VALUES:
$\vec{V_A}, \vec{V_B}, \vec{V_C}, \vec{I_A}, \vec{I_B}, \vec{I_C}.$

62 — DO FAST FOURIER TRANSFORMS ON STORED VALUES TO OBTAIN PHASOR ANGLES $\Theta_1 - \Theta_6$ FOR RESPECTIVE STORED VALUES

64 — CALCULATE NEGATIVE SEQUENCE VOLTAGE AND CURRENT VALUES
$$\vec{V_{a2}} = \tfrac{1}{3}(\vec{V_a} + \alpha^2 \vec{V_b} + \alpha \vec{V_c})$$
$$\vec{I_{a2}} = \tfrac{1}{3}(\vec{I_a} + \alpha^2 \vec{I_b} + \alpha \vec{I_c})$$
WHERE: $\alpha = e^{j120°} = -0.5 + j0.866$;
$\vec{V_a} = V_A \angle \Theta_1 ; \vec{V_b} = V_B \angle \Theta_2 ; \vec{V_c} = V_C \angle \Theta_3$
$\vec{I_a} = I_A \angle \Theta_4 ; \vec{I_b} = I_B \angle \Theta_5 ; \vec{I_c} = I_C \angle \Theta_6$

METHOD FOR INCIPIENT FAILURE DETECTION IN ELECTRIC MACHINES

FIELD OF THE INVENTION

This invention relates to multiphase electric machines, and more particularly, to a monitoring system for such machines that enables the identification of incipient failure modes.

BACKGROUND OF THE INVENTION

Unexpected failure of a motor in an industrial or military environment can result in costly downtime, increased safety hazards and possible catastrophic failure of other components or processes. Over the years, a variety of periodic test procedures have been developed to allow the prediction of incipient failures in motors. Most have functioned in a less than satisfactory manner.

Insulation evaluation techniques, such as "Megger" testing, are popular and have been performed for many years. Those tests involve a direct-current method and are convenient to use. A megohmmeter is typically used although high-potential testers may also be used.

Three types of DC tests are typically employed: the time resistance test, dielectric absorption ratio and the step voltage test. Such DC tests are only capable of revealing some incipient problems, and their use requires that the electric machinery be taken off line and tested in a non-operational mode. Furthermore, the results of DC tests are relative and therefore, their evaluation is based on trends over time, rather than on a specific value of one reading.

Other tests, including partial-discharge tests, detect charge transfer in insulation voids under an applied AC voltage. Power-factor tests measure dielectric power factor and use it as an evaluation parameter. Surge tests utilize the natural response of the windings to an impressed transient voltage to detect winding or dielectric defects; typically windings are examined in pairs, with the assumption that any differences between the responses of the two windings are indicative of defects. The test apparatus for performing such tests is typically expensive and the test procedures are difficult to employ, requiring skilled personnel and "near-laboratory-like" conditions to perform the tests successfully. Their use also requires that the electric machinery be taken off line and tested in a non-operation mode. Moreover, surge testing can be destructive to the motor under test.

There is a need for a monitoring system that can detect all modes of incipient failures in stator windings of electric machines and other common failure modes in the rotor. The method should pose no risk of damage to insulation systems during its use and should be able to be used outside of a test facility and while the electric machine is in operation. It should further be immune to power system variations and transients which could mask an incipient failure condition.

Recently, the inventors hereof found that early detection of incipient failures in electrical motors can be achieved by the monitoring of changes in negative sequence current and impedance of a multi-phase motor (see: "Alternative For Assessing the Electrical Integrity of Induction Motors", Kohler et al., Conference record of the 1989 IEEE Industry Application Society Annual Meeting part II, Oct. 1-5, 1989.).

Before discussing the findings of Kohler et al., it is worthwhile to review the method for dealing with unbalanced polyphase circuits, termed "method of symmetrical components" that was first published by C. L. Fortescue in "Method of Symmetrical coordinates Applied to the Solution of Polyphase Networks", Transactions of the AIEE Volume 37, pages 1027-1140, 1918.

Figure 1:
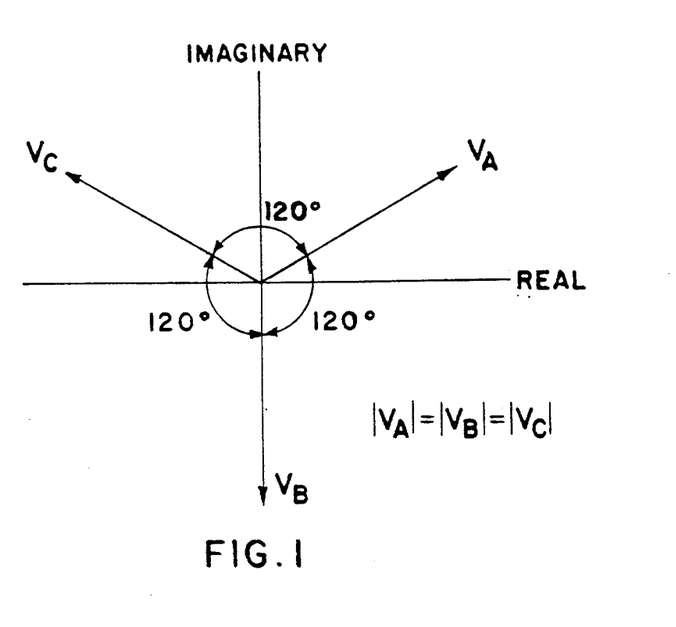
FIG. 1 is a phasor diagram showing a balanced three phase system of voltages.
Figure 2:
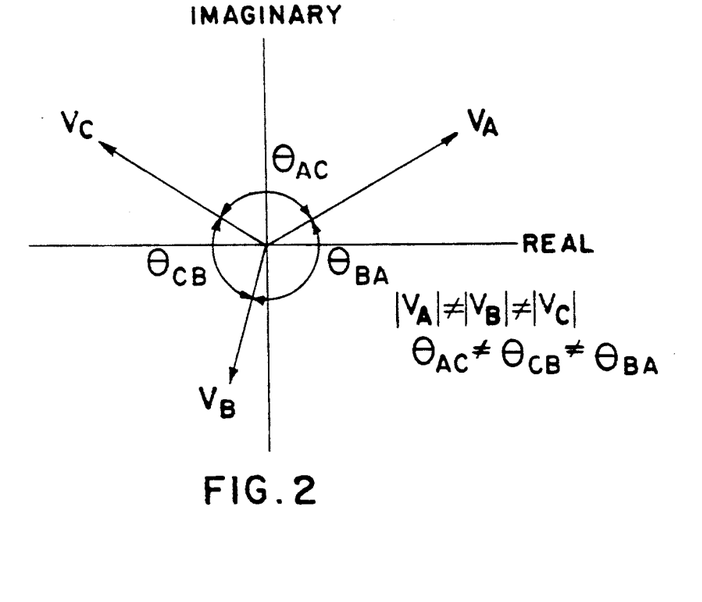
FIG. 2 is a phasor diagram showing an unbalanced three phase system of voltage phasors.

The symmetrical component method provides a convenient technique for simplifying calculations relating to unbalanced power systems. Most power system calculations are performed on a per-phase basis, with an assumption that the system is perfectly balanced. As shown in FIG. 1, a balanced three phase system means that the three voltage phasors $V_A$, $V_C$, $V_B$ each have an equal magnitude and are phase displaced by 120°. The same relationship must also exist for the three current phasors. If however, phasors exist such as shown in FIG. 2, where the magnitude of the voltage or current phasors are unequal, and/or the angles therebetween are different, then the application of classical circuit-analysis techniques becomes cumbersome.

Fortescue found that an unbalanced system of n phasors could be resolved into n systems of balanced phasors (called the "symmetrical components") of the original phasors. The n phasors of each set of components are balanced, that is, equal in magnitude and the angles between adjacent phasors of the set are also equal. Thus, an unbalanced system can be analyzed as a group of balanced systems, thereby simplifying the analysis.

Figure 3:
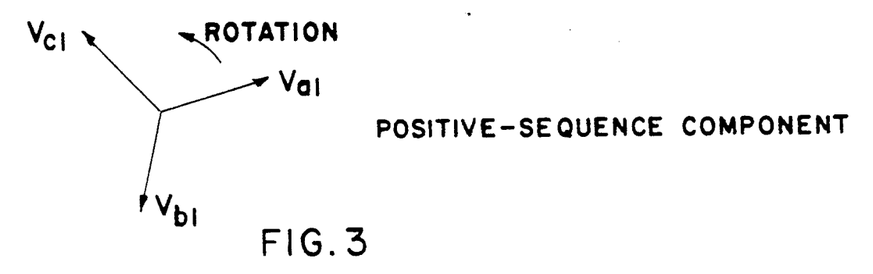
FIG. 3 is a phasor diagram showing positive-sequence components derived from a symmetrical component analysis.
Figure 4:
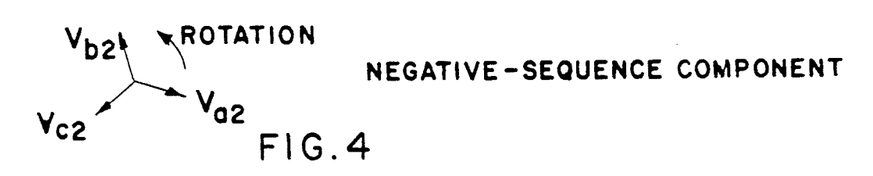
FIG. 4 is a phasor diagram showing negative-sequence components derived from a symmetrical components analysis.
Figure 5:
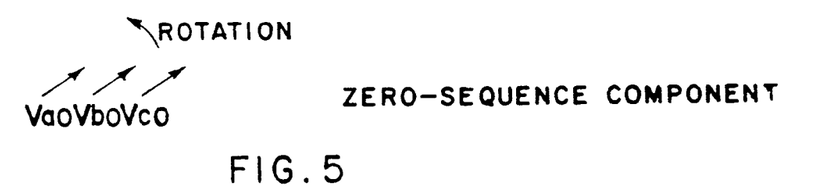
FIG. 5 is a phasor diagram showing zero-sequence components derived from a symmetrical components analysis.
Figure 6:
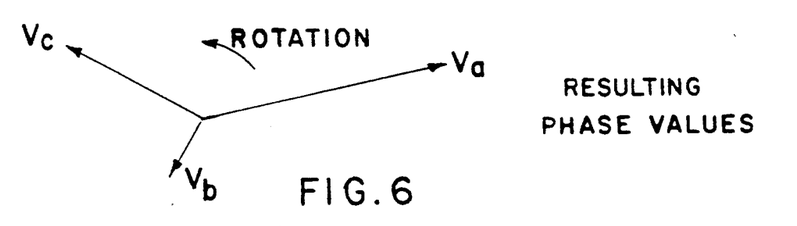
FIG. 6 is a phasor diagram showing combined positive, negative and zero sequence components, to indicate an unbalanced three phase voltage supply.

The symmetrical components for an unbalanced three-phase system of phasors, as defined by Fortescue, are shown in FIGS. 3, 4, and 5. In FIG. 3, positive sequence components are shown and consist of three phasors that are equal in magnitude, are displaced from each other by 120°, and have the same phase sequence as the original phasors. In FIG. 4, negative-sequence components are shown and consist of three phasors that are equal in magnitude, are displaced from each other by 120° and have a phase sequence that is opposite to that of the positive sequence phasors. In FIG. 5, zero-sequence components are shown and consist of three phasors that are equal in magnitude and exhibit a zero phase displacement from each other. Given that the phasors shown in FIGS. 3, 4, and 5 are from an unbalanced three phase supply, their respective vector additions will result in the phasor values shown in FIG. 6, which represents the original phasors of an unbalanced three phase system. An important premise of the theory of symmetrical components is that the individual positive, negative and zero sequence components are independent and do not react, one upon the other for a symmetrical machine. Using the theory of symmetrical components analysis, the presence of only positive-sequence voltages and currents indicates a perfectly balanced power system, serving balanced loads. The presence of negative-sequence values indicate some level of system imbalance (faults, single phase loads, etc.). The presence of a zero-sequence component represents a fault involving ground.

Kohler et al, in the above noted IEEE paper, found that negative sequence components (i.e., current, voltage and impedance) bore a direct relationship to incipient failures in electric motors. First, a motor's negative sequence impedance is relatively insensitive to speed changes and other non-motor anomalies. Kohler et al demonstrated that high-impedance leakage paths within motor windings could be identified by measurements of negative-sequence currents. Such negative sequence currents were found to be directly proportional to leakage currents at constant voltages. Furthermore, for such constant leakage currents, the level of negative sequence current increased with increasing potential—thus reflecting an increase in deterioration severity. Kohler et al further found that the level of predictive ability achieved by monitoring of negative-sequence currents could be adversely affected by supply line variations, but that the calculation and use of the negative sequence current to an effective-negative-sequence impedance negated such variations. Thus, by monitoring of negative-sequence impedance, incipient motor failure modes could be an effective metric for monitoring the state of an in-service motor.

While the monitoring of changes in negative sequence impedance has been found to be an effective means of monitoring incipient failure modes, certain failure modes exhibit relatively small changes in the negative sequence impedance. Such small changes may be masked by detection system margins and other variables.

Accordingly, it is an object of this invention to provide an improved method for monitoring electric motors for incipient failure modes.

It is another object of this invention to provide improved negative sequence component monitoring which enables earlier and more precise identification of incipient failure modes.

SUMMARY OF THE INVENTION

An improved method for detecting an incipient failure in a multiphase electric motor includes the following steps: periodically measuring, or continuously monitoring, voltage and current values at each input to the motor; determining negative sequence voltage and current values for each measured input voltage and current value; calculating a negative sequence impedance phasor value angle from each of the determined negative sequence voltages and current values; and comparing the calculated negative sequence impedance phasor angles and/or real and imaginary components over a plurality of periodic measurements to detect a change therein, which change is indicative of an incipient failure mode.

DETAILED DESCRIPTION OF THE INVENTION

As indicated in the background of the invention, the inventors hereof have previously found that a variation in effective negative sequence impedance of an operational polyphase motor will indicate an incipient failure mode. However, under certain conditions the effective negative sequence impedance does not exhibit substantial sensitivity to certain incipient defects. For instance, in FIG. 7 a plot of the absolute value of negative sequence impedance ($Z_2$(eff)) is shown by plot 10. That plot is for a motor with a very small turn-to-turn short that commences on day 6 of the motor's operation. As can be seen, while the effective negative-sequence impedance changes in response to deterioration, there is only a 19% change between the average value before the deterioration and the value afterwards.

Figure 7:
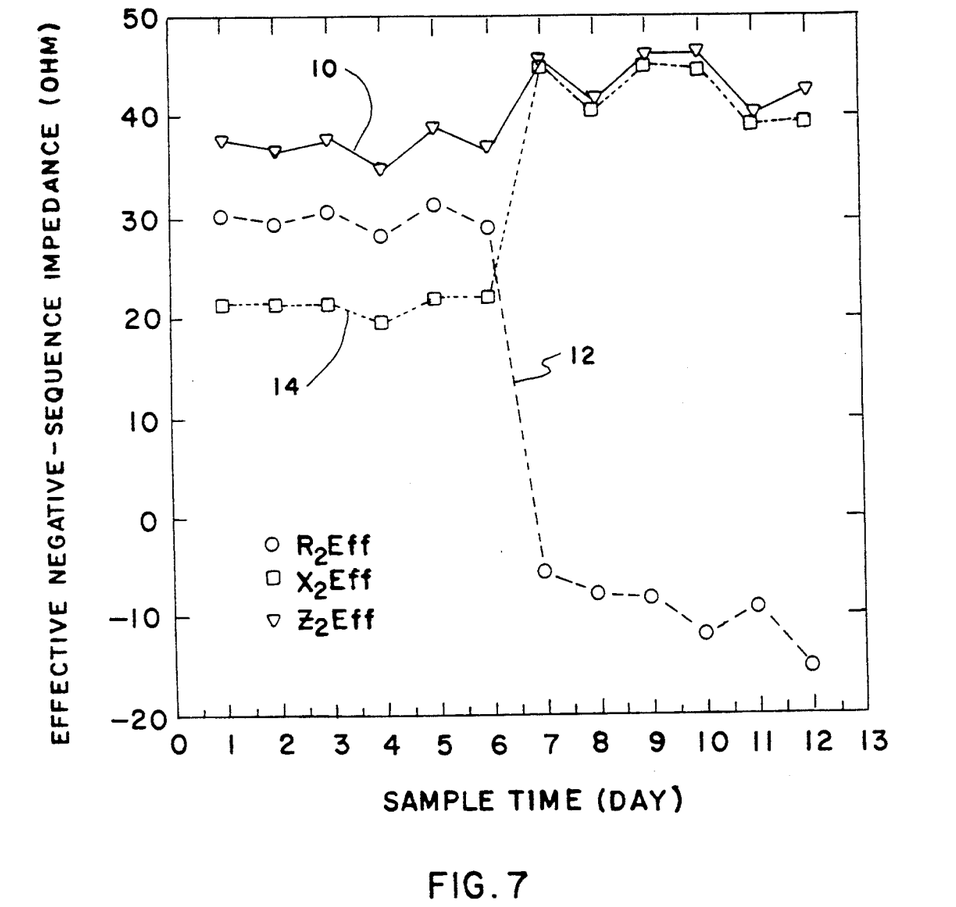
FIG. 7 is a plot of effective negative sequence impedance versus time of a motor having a small stator-turn defect.

By contrast, if the effective negative-sequence impedance is separated into its real and imaginary components ($R_2$(eff), $X_2$(eff)), an entirely different story results. Plot 12 indicates changes in $R_2$(eff), whereas plot 14 indicates changes in $X_2$(eff). It can be seen that plots 12 and 14 diverge significantly on day 6 and, in effect, mask the changes in each other due to their opposite-going transition states.

The effective negative-sequence impedance shown in FIG. 7 can be represented as a phasor which has an absolute value of $Z_2$(eff) and an angle $\theta_{a2}$(eff). The value of $\theta_{a2}$(eff) is expressed by the following relations.

$$\theta_{a2}(\text{eff}) = \tan^{-1} \frac{Im\ \{\vec{Z}_{a2}(\text{eff})\}}{Re\ \{\vec{Z}_{a2}(\text{eff})\}}\ ;\ \text{or} \tag{1}$$

$$\theta_{a2}(\text{eff}) = \tan^{-1} \frac{X_2\ (\text{eff})}{R_2\ (\text{eff})} \tag{2}$$

From equations 1 and 2, it can be seen that $\theta_{a2}$(eff) is highly sensitive to changes in imaginary and real components of the negative-sequence impedance—even when those values tend to mask each other when combined into overall negative sequence impedance value $Z_2$(eff). In fact, examination of the chart of FIG. 7 will show that there is a 185% change between the average value of $\theta_{a2}$ (eff) before deterioration and its average value after deterioration. The change between the largest value for deterioration and the minimum value afterwards is 147%. Thus, the effective negative sequence angle $\theta_{a2}$(eff) has been found to be much more sensitive to deterioration than the effective negative-sequence impedance (approximately 20 to 50 times or so).

It is important to note however, that the ratio of the imaginary and real parts of the complex $\vec{Z}_{a2}$(eff), as shown in equations 1 and 2, itself has value as an evaluation parameter (before the arctangent is computed). In the foregoing example, for instance, the arctangent of the ratio, which happens to be a physically defined quantity known as "an angle", was used as the evaluation parameter in certain situations, however, it can be desirable to observe the behavior of the numerator and denominator of the ratio, either individually or jointly, in conjunction with the ratio or some mathematical operation of the ratio, such as the arctangent.

Figure 8:
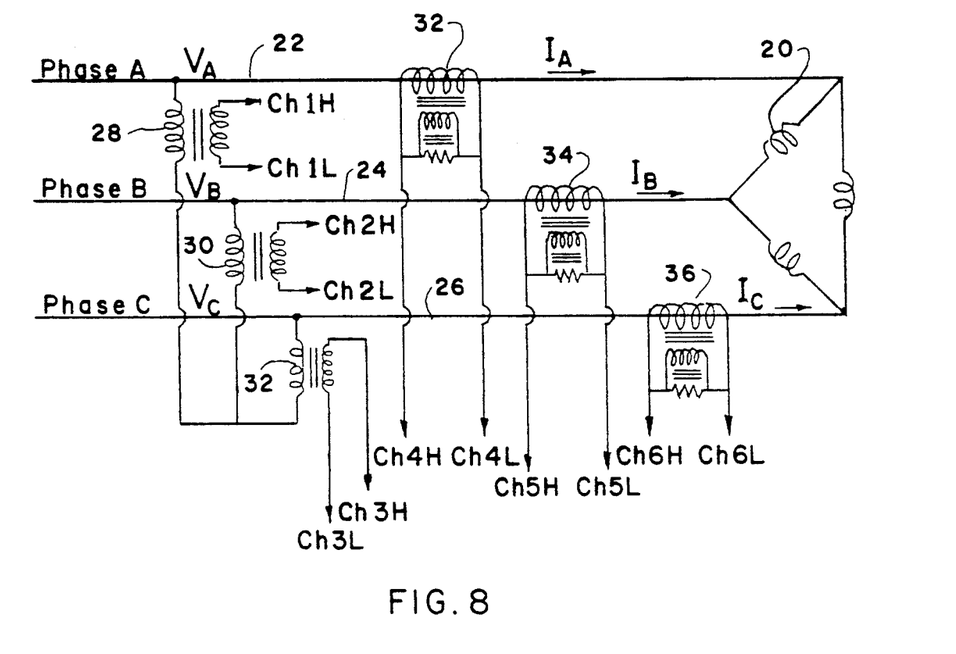
FIG. 8 is a circuit diagram for detecting three phase voltages and currents as they are fed to a delta-connected motor.
Figure 9:
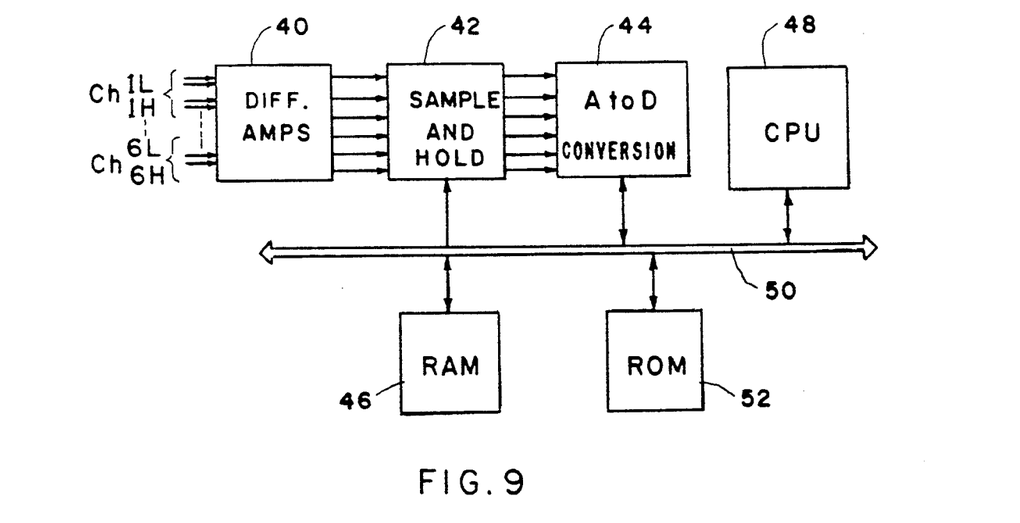
FIG. 9 is a block diagram of a monitoring system which incorporates the invention hereof.

Turning now to FIGS. 8 and 9, circuits for monitoring $\theta_{a2}$(eff) and indicating incipient failure modes will be described. In FIG. 8, a delta-connected, three phase motor 20 is schematically shown and is connected to a three phase source having phases A, B, C supplied via lines 22, 24 and 26. Each of supply lines 22, 24, 26 has its absolute voltage value monitored through a connected voltage transformer 28, 30 and 32, respectively. For instance, transformer 28 is connected to phase A supply line 22 and provides both high and low outputs to channel one of a six channel monitoring differential amplifier circuit (see 40 in FIG. 9). Voltage transformers 30 and 32 are likewise connected and provide voltage values for phases B and C. Similarly, three, two-stage current transformers 32, 34 and 36 provide high and low current indications to channels 4, 5, and 6 of differential amplifiers 40.

In FIG. 9, monitoring circuit 40 comprises a set of differential amplifiers, one for each of channels 1-6 (from the circuit of FIG. 8). Each differential amplifier provides an output indicative of its monitored voltage or current to a sample and hold circuit 42, where instantaneous analog values are detected and temporarily stored. An Analog to Digital conversion circuit 44 converts the analog values held in sample and hold circuit 42 to digital values and causes them to be stored in random access memory (RAM) 46. A central processing unit 48 communicates with and controls all of the elements of the circuit of FIG. 9, via bus 50. Control programming for processing unit 48 may be contained in a read only memory (ROM) 52 or in the alternative, within RAM 46.

CPU 48 periodically causes sample and hold circuit 42 to produce voltage and current samples from each of channels 1-6. Once the samples are converted to digital values and stored, CPU 48 then performs a variety of processing steps to derive phasor angles ($\theta_1$-$\theta_6$) for each of the six input variables ($V_A$, $V_B$, $V_C$, $I_A$, $I_B$, $I_C$). These actions are illustrated in boxes 60 and 62 in FIG. 10(a). Those actions take place, periodically, in accordance with sample command inputs to sample and hold circuit 42 from CPU 48. The preferred method for determining the relative phase angles of the phasors is via a fast Fourier transform procedure that enables zero crossings to be accurately determined (and noise eliminated).

Figure 10A:
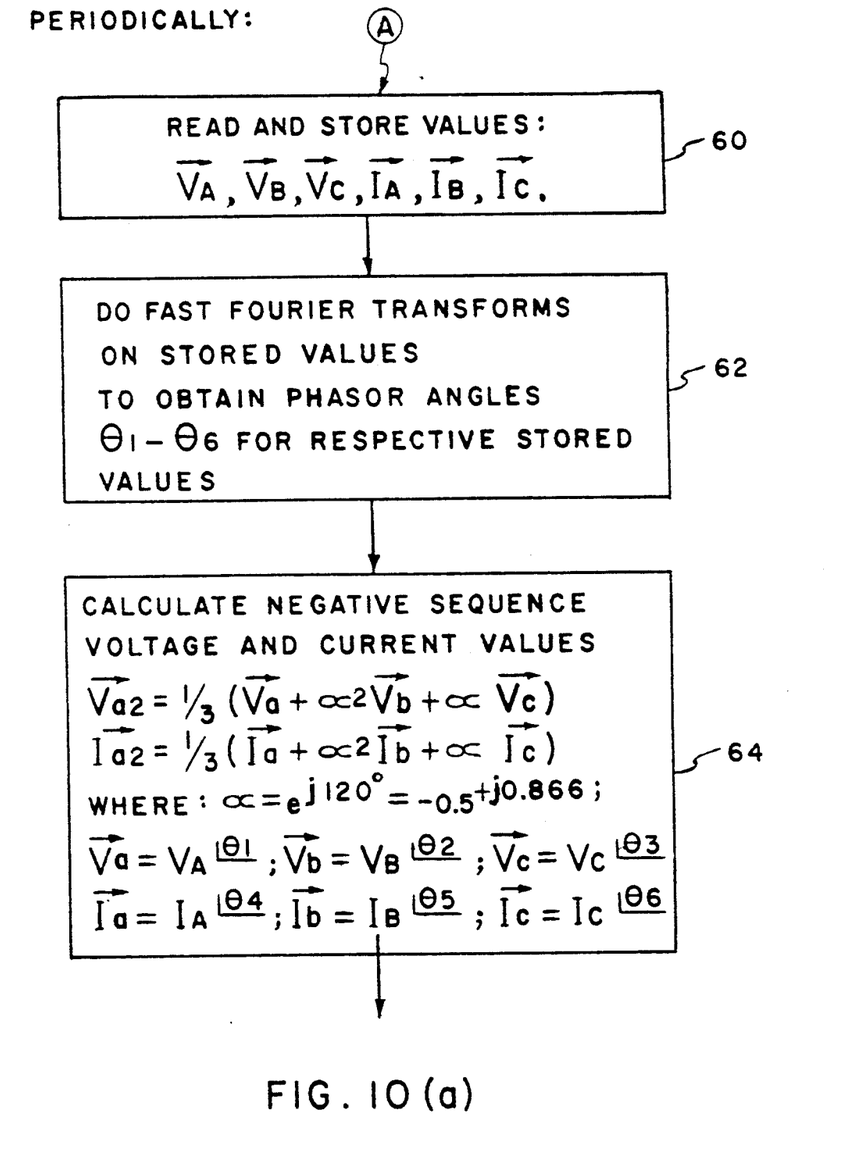
FIGS. 10(a) and 10(b), illustrate a flow diagram helpful in understanding the operation of the system of FIG. 9.

Next, negative sequence, voltage and current values are calculated (Box 64) using vector expressions 3 and 4 below;

$$\vec{V}_{a2} = \tfrac{1}{3}(\vec{V}_a + a^2 \vec{V}_b + a \vec{V}_c) \tag{3}$$

$$\vec{I}_{a2} = \tfrac{1}{3}(\vec{I}_a + a^2 \vec{I}_b + a \vec{I}_c) \tag{4}$$

wherein : $a = e^{j120}$ $$\vec{V}_a = V_A \, \theta 1; \vec{V}_b = V_B \, \theta 2; \vec{V}_c = V_C \, \theta 3$$

$$\vec{I}_a = I_A \, \theta 4; \vec{I}_b = I_B \, \theta 5; \vec{I}_c = I_C \, \theta 6$$

Figure 10B:
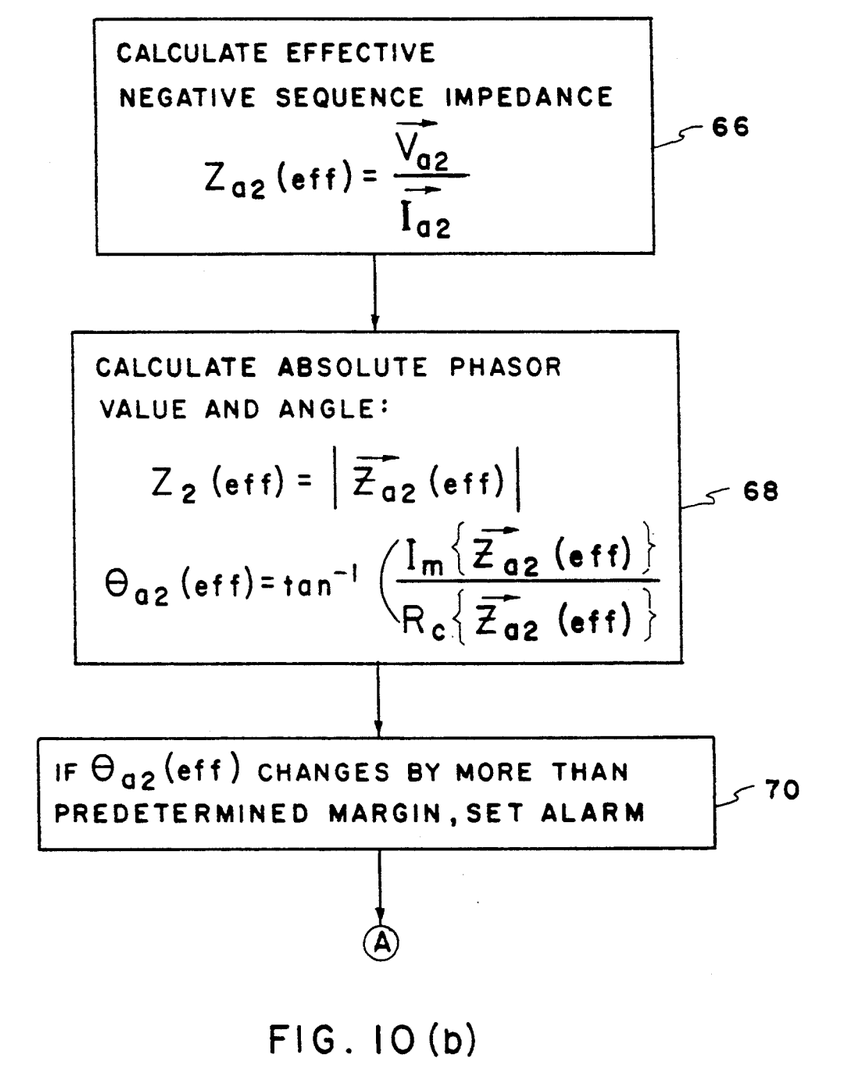

Once the negative sequence voltage and current values $\vec{V}_{a2}$ and $\vec{I}_{a2}$ have been derived, the effective negative sequence impedance $\vec{Z}_{a2}$(eff) is calculated as shown in equation 5 (Box 66, FIG. 10(b)).

$$\vec{Z}_{a2}(\text{eff}) = \frac{\vec{V}_{a2}}{\vec{I}_{a2}} \tag{5}$$

The calculated effective negative sequence impedance $\vec{Z}_{a2}$(eff) is a vector quantity having an absolute value $Z_2$(eff) and a phasor angle $\theta_{a2}$(eff). The value of $\theta_{a2}$(eff) is calculated as shown in equations 6 and 7. (see box 68):

$$\theta_{a2}(\text{eff}) = \tan^{-1} \frac{Im\{\vec{Z}_{a2} \text{ (eff)}\}}{Re\{\vec{Z}_{a2} \text{ eff}\}} ; \text{ or} \tag{6}$$

$$\theta_{a2}(\text{eff}) = \tan^{-1} \frac{jX_2 \text{ (eff)}}{R_2 \text{ (eff)}} \tag{7}$$

Once the value of $\theta_{a2}$(eff) is determined, its value is compared against margin limits. If it exceeds those limits, an alarm is set indicating the detection of an incipient failure mode. (box 70). The margin limits are determined by the margins that exist within the sensing circuits and empirical variations experienced with the particular motor under test.

The use of the effective negative sequence impedance $\vec{Z}_{a2}$(eff) to determine an incipient fault condition removes from the measurement calculation a variation resulting from an unbalance in the supply lines. An unbalanced supply can occur when a single phase device is tied to one line and causes an imbalance in the voltages or phasor angles seen across the three phase supply lines. This unbalance could obscure the effect of the deterioration by altering the values of the symmetrical components used in the detection process. By employing the ratio of the negative sequence voltage to the negative sequence current, any supply variation is negated (by the ratio) and does not appear in the end result. The use of the phasor angle $\theta_{a2}$(eff) provides a sensitive indicator of an incipient fault condition that avoids the previously experienced masking effects illustrated by the chart of FIG. 7. Even when such masking effects are not so pronounced, the use of $\theta_{a2}$(eff) as a fault indicator, will, under most circumstances, provide a more sensitive indicator of a fault condition.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method for detecting an incipient failure in a multiphase electric motor, said motor having an input for each phase from a supply source, said method comprising the steps of:
    (a) performing a plurality of successive measurements of simultaneous voltage and current values at each said input;
    (b) determining negative sequence voltage and current vector values for a plurality of said measured voltage and current values;
    (c) calculating effective negative sequence impedance phasor angles from said determined negative sequence voltage and current vector values; and
    (d) comparing a plurality of said effective negative sequence impedance phasor angles to detect a change therein as indicative of said incipient failure.

2. The method as recited in claim 1, wherein said supply source provides three phases, said phases arbitrarily designated A, B, and C.

3. The method as recited in claim 2, wherein each negative sequence current and voltage vector value is determined from the following relations:

$$\vec{I}_{a2} = \tfrac{1}{3}(\vec{I}_a + a^2\vec{I}_b + a\vec{I}_c)$$

$$\vec{V}_{a2} = \tfrac{1}{3}(\vec{V}_a + a^2\vec{V}_b + a\vec{V}_c)$$

where: $a = e^{j120} = -0.5 + j.866$ $\vec{V}_a = V_A \, \theta 1$ $\vec{V}_b = V_B \, \theta 2$ $\vec{V}_c = V_C \, \theta 3$ $\vec{I}_a = I_A \, \theta 4$ $\vec{I}_b = I_B \, \theta 5$ $\vec{I}_c = I_C \, \theta 6$ 4. The method as recited in claim 3, wherein said negative sequence impedance phasor angle $\theta_{a2}(\text{eff})$ is derived as follows:

$$\theta_{a2}(\text{eff}) = \tan^{-1}\frac{Im\{Z_{a2}(\text{eff})\}}{Re\{Z_{a2}(\text{eff})\}} = \tan^{-1}\frac{\vec{X}_2(\text{eff})}{R_2(\text{eff})}$$

where: $\vec{Z}_{a2}(\text{eff}) = \vec{V}_{A2}/\vec{I}_{a2}$

5. The method as recited in claim 3, wherein each said negative sequence impedance vector value is derived from a ratio of negative sequence voltage to negative sequence current vector values, whereby supply source variations are negated.

6. The method as recited in claim 5 wherein an incipient failure is indicated only when said negative sequence phasor angle changes by more than a predetermined limit.

7. A method for detecting an incipient failure in a multiphase electric motor, said motor having an input for each phase from a supply source, said method comprising the steps of:
   (a) performing a plurality of successive measurements of simultaneous voltage and current values at each said input;
   (b) determining negative sequence voltage and current vector values for a plurality of said measured voltage and current values;
   (c) calculating effective negative sequence impedance vector values from said determined negative sequence voltage and current vector values; and
   (d) comparing like components of said effective negative sequence impedance vector values over a plurality of measurements to detect a change therein as indicative of said incipient failure.

8. The method as recited in claim 7 wherein step (d) compares real components of said effective negative sequence impedance vector values.

9. The method as recited in claim 7 wherein step (d) compares imaginary components of said negative sequence impedance vector values.

* * * * *